US009124300B2

(12) United States Patent
Sharon et al.

(10) Patent No.: US 9,124,300 B2
(45) Date of Patent: Sep. 1, 2015

(54) ERROR CORRECTION CODING IN NON-VOLATILE MEMORY

(71) Applicant: SANDISK TECHNOLOGIES INC., Plano, TX (US)

(72) Inventors: Eran Sharon, Rishon Lezion (IL); Idan Alrod, Herzliya (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 184 days.

(21) Appl. No.: 13/781,321

(22) Filed: Feb. 28, 2013

(65) Prior Publication Data

US 2014/0245098 A1 Aug. 28, 2014

(51) Int. Cl.
| | |
|---|---|
| H03M 13/00 | (2006.01) |
| H03M 13/29 | (2006.01) |
| G06F 11/10 | (2006.01) |
| H03M 13/25 | (2006.01) |
| H03M 13/11 | (2006.01) |

(52) U.S. Cl.
CPC ....... *H03M 13/2906* (2013.01); *G06F 11/1012* (2013.01); *H03M 13/2942* (2013.01); *H03M 13/11* (2013.01); *H03M 13/255* (2013.01)

(58) Field of Classification Search
CPC   H03M 13/11; H03M 13/255; H03M 13/2942
USPC ................................. 714/766, 753
See application file for complete search history.

(56) References Cited

U.S. PATENT DOCUMENTS

| | | | |
|---|---|---|---|
| 7,493,457 B2 | 2/2009 | Murin | |
| 7,827,472 B2 | 11/2010 | Crozier et al. | |
| 7,844,877 B2 | 11/2010 | Litsyn et al. | |
| 2005/0193312 A1* | 9/2005 | Smith et al. | 714/755 |
| 2006/0123328 A1* | 6/2006 | Tonami et al. | 714/801 |
| 2007/0229327 A1* | 10/2007 | Chen et al. | 341/59 |
| 2008/0140686 A1* | 6/2008 | Hong et al. | 707/100 |
| 2009/0177943 A1 | 7/2009 | Silvus et al. | |
| 2009/0241009 A1* | 9/2009 | Kong et al. | 714/763 |
| 2012/0030535 A1 | 2/2012 | Betts | |
| 2013/0024746 A1 | 1/2013 | Sharon et al. | |
| 2013/0246878 A1* | 9/2013 | Pancholi et al. | 714/752 |
| 2014/0122963 A1* | 5/2014 | Motwani et al. | 714/758 |

FOREIGN PATENT DOCUMENTS

| | | |
|---|---|---|
| WO | 2009028281 A1 | 3/2009 |
| WO | 2013016168 A2 | 1/2013 |

OTHER PUBLICATIONS

Invitation to Pay Additional Fees, and, Where Applicable, Protest Fee and Partial International Search Report mailed Jun. 3, 2014 in International Application No. PCT/US2014/017930, 6 pages.
International Search Report and Written Opinion of the International Searching Authority (EPO) for International Application No. PCT/US2014/017930, mailed Aug. 4, 2014, 12 pages.

* cited by examiner

*Primary Examiner* — M. Mujtaba K Chaudry
(74) *Attorney, Agent, or Firm* — Toler Law Group, PC

(57) ABSTRACT

A method includes encoding data bits into codewords according to a first error correction encoding scheme. The method includes storing the codewords into a memory and generating a combined codeword by encoding, at the memory, the codewords according to a second error correction encoding scheme to generate parity bits of the combined codeword. The method includes, after storing the codewords into the memory, storing the parity bits of the combined codeword into the memory.

32 Claims, 5 Drawing Sheets

ERROR CORRECTION CODING IN NON-VOLATILE MEMORY

FIELD OF THE DISCLOSURE

The present disclosure is generally related to data encoding for error correction.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g., "parity bits") that may be stored with the data as an ECC codeword. As more parity bits are used, an error correction capacity of the ECC increases and a number of bits required to store the encoded data also increases.

In order to take advantage of increased error correction capability due to increased codeword length, ECC codewords may be formed that span multiple logical pages of a MLC flash memory. However, storage of multiple pages of data in a controller of a data storage device for encoding into a multi-page codeword may require additional complexity and memory (e.g., random access memory (RAM)) at the controller (and therefore increased cost of manufacture), increased write latency, and/or increased risk of data loss in the event of power loss at the controller before the multi-page codeword can be transferred to non-volatile memory.

SUMMARY

ECC codewords that have been stored at a non-volatile memory are combined to generate a longer ECC codeword by generation, at the non-volatile memory, of additional parity bits that correspond to the combined codeword. If an ECC codeword is uncorrectable upon being read from the non-volatile memory, the additional parity bits may be read from the non-volatile memory and used by an ECC decoder to decode the ECC codeword, providing increased error correction capacity.

DETAILED DESCRIPTION

Figure 1:
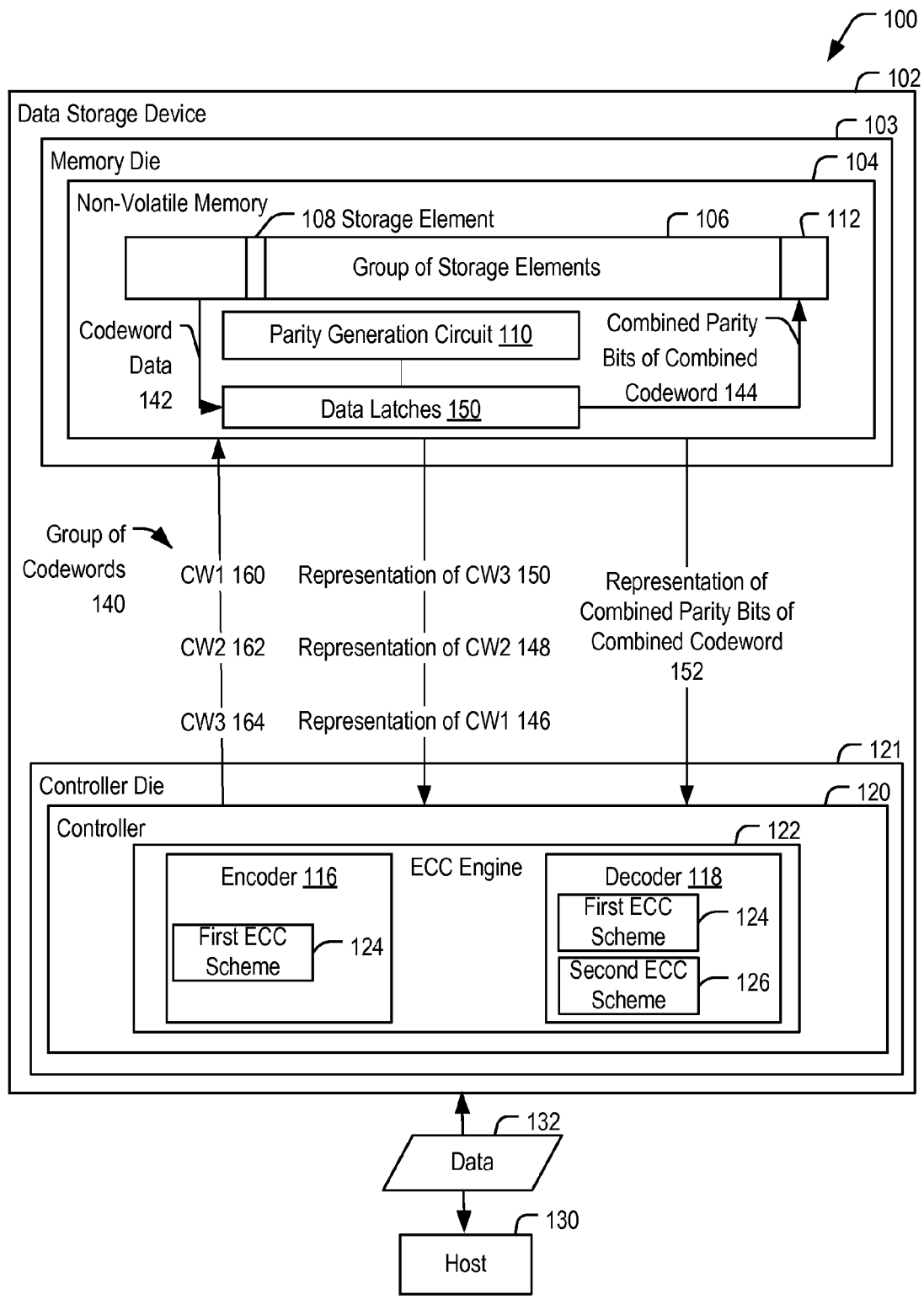
FIG. 1 is a block diagram of a first illustrative embodiment of a system including a data storage device that is operable to generate parity bits at a memory die.

Referring to FIG. 1, a particular embodiment of a system 100 includes a data storage device 102 coupled to a host device 130. The data storage device 102 includes a memory die 103 with parity generation circuitry 110 configured to generate and store parity bits for a combined codeword formed from multiple ECC codewords at a memory 104.

The host device 130 may be configured to provide data, such as user data 132, to be stored at the memory 104 or to request data to be read from the memory 104. For example, the host device 130 may include a mobile telephone, a music or video player, a gaming console, an electronic book reader, a personal digital assistant (PDA), a computer, such as a laptop computer, a notebook computer, or a tablet, any other electronic device, or any combination thereof.

The data storage device 102 includes the memory die 103 coupled to a controller die 121. The memory 104 may be a non-volatile memory on the memory die 103, such as a NAND flash memory. The memory 104 includes a representative group 106 of storage elements, such as a word line of a multi-level cell (MLC) flash memory. The group 106 includes a representative storage element 108, such as a flash MLC cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples.

A controller 120 on the controller die 121 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data and a write command to instruct the memory 104 to store data to a specified address. As another example, the controller 120 is configured to send a read command to read data from a specified address of the memory 104.

The controller 120 includes an ECC engine 122 that is configured to receive data to be stored to the memory 104 and to generate a codeword. For example, the ECC engine 122 may include an encoder 116 configured to encode data using a first ECC scheme 124, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof.

The ECC engine 122 also includes a decoder 118 configured to decode data read from the memory 104, The decoder 118 is configured to detect and correct, up to an error correction capability of the first ECC scheme 124, bit errors that may be present in the data. The decoder 118 is configured to decode data according to a second ECC scheme 126 using parity bits of a combined codeword read from the memory 104 in the event decoding fails using the first ECC scheme 124.

The controller 120 is configured to encode data bits, such as the user data 132, into a group of codewords 140 according to the first ECC scheme 124. For example, the group of codewords 140 may include a first codeword (CW1) 160 that has a first set of data bits and a first set of parity bits, a second codeword (CW2) 162 that has a second set of data bits and a second set of parity bits, and a third codeword (CW3) 164 that has a third set of data bits and a third set of parity bits. After encoding each portion of the user data 132 into a codeword 160, 162, or 164 of the group of codewords 140, the controller 120 may be configured to send the codewords 160, 162, or 164 to be stored in the memory 104.

The parity generation circuitry 110 is configured to generate a combined codeword on the memory die 103 by encoding the group of codewords 140 according to the second error correction encoding scheme 126 to generate combined parity bits 144 of the combined codeword. The memory 104 is configured to store the combined parity bits 144 after storing the codewords of the group 140 into the memory 104. For example, the parity generation circuitry 110 may be configured to receive the codewords of the group 140 of codewords read from the memory 104 to generate the combined parity bits 144. To illustrate, after the codewords 160, 162, and 164 are stored in the non-volatile memory 104, codeword data 142 of each of the codewords 160-164 may be loaded into data latches 150.

The data latches 150 may be used for reading and writing to the memory 104. In a read mode, the data latches 150 may receive sensed data from storage elements of the memory 104. The sensed data may be processed within the data latches 150 and transferred to the controller 120. In a write mode, the data latches 150 may receive data from the controller 120. The data in the data latches 150 may be programmed into storage elements of the memory 104.

The group of codewords 140 may be encoded according to the second error correction encoding scheme 126 by applying a bitwise logical operation to the data in the data latches 150. For example, each of the parity bits of the combined codeword may be generated according to an XOR operation of bits from each codeword 160-164 of the group 140. The combined parity bits 144 may be stored with the codewords 160-164 in the group of storage elements 106, such as in a dedicated combined parity portion 112. In an alternative implementation, the combined parity bits 144 may be computed in the controller 120, such as in an encoder configured encode data using the second ECC scheme 126. For example, the group of codewords 140 may be transferred to the controller 120, encoded using the second ECC scheme 126. As another example, codewords of the group of codewords 140 may be decoded at the decoder 118 prior to re-encoding according to the first ECC scheme 124 and the second ECC scheme 126 at the encoder 116.

Figure 2:
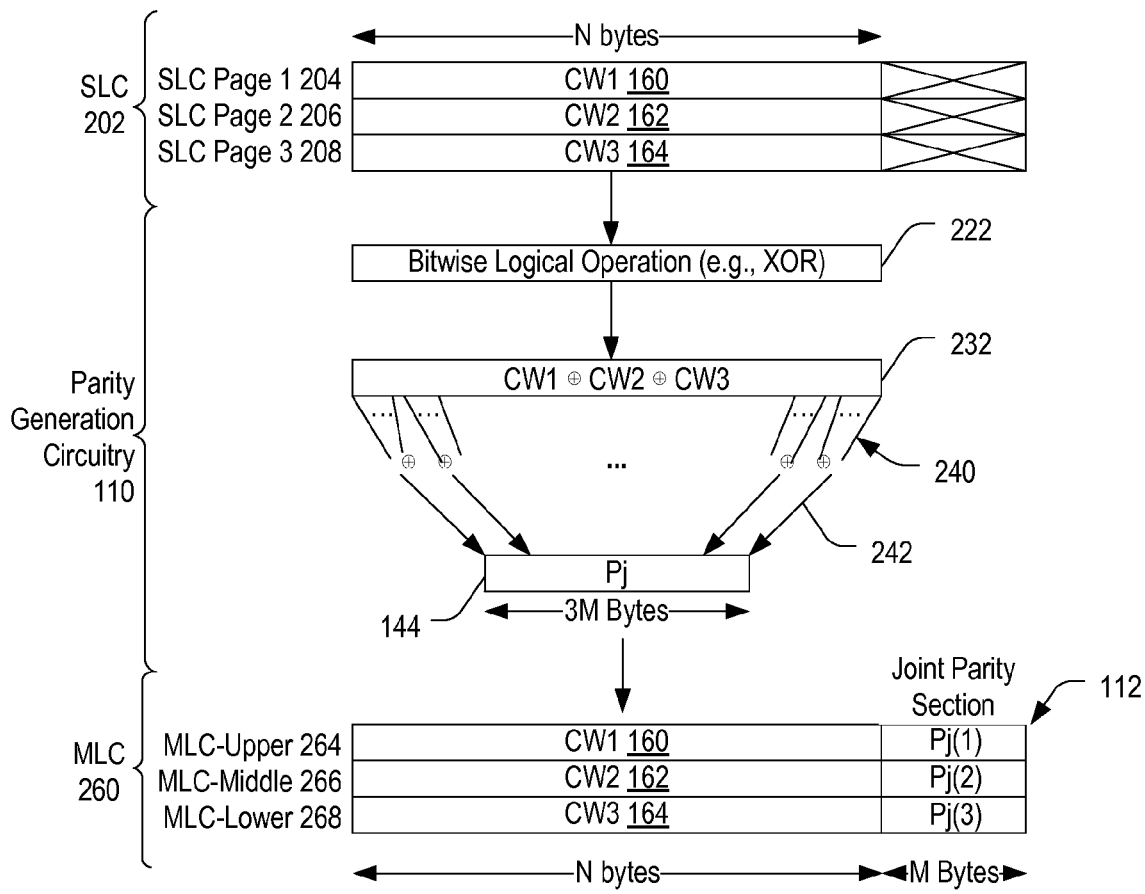
FIG. 2 is a diagram illustrating an example of generating parity bits at the memory die of FIG. 1.

As described in further detail with respect to FIG. 2, the memory 104 may be a flash memory that includes a single level cell (SLC) portion and a multi-level cell (MLC) portion. The group of codewords 140 may be stored into the SLC portion, and the combined codeword may be stored into the MLC portion. The combined codeword may be stored into multiple logical pages of a single word line of the multi-level cell (MLC) portion of the flash memory, and each of the codewords 160-164 of the group 140 may be stored in a respective one of the logical pages.

During operation, the user data 132 may be received at the controller 122 and provided to the encoder 116 to be encoded according to the first ECC scheme 124. The encoder 116 may independently encode each of the codewords 160, 162, 164 of the group 140 to be decodable independent of the other codewords of the group 140. The resulting codewords 160-164 may be transferred from the controller 120 to the memory die 103.

At the memory die 103, the codewords 160-164 of the group 140 may be programmed into a binary cache portion of the memory 104. For example, each codeword 160-164 may be stored into a separate word line of a SLC portion of the memory 104. After the codewords 160-164 are stored into the memory 104, the codewords 160-164 may be encoded into a combined codeword by generation of the combined parity bits 144 at the parity generation circuitry 110. For example, the combined parity bits 144 may be generated by reading the codewords 160-164 of the group 140 from the binary cache into the data latches 150 on the memory die 103. As described in the example of FIG. 2, a bit-wise logical operation, such as an XOR operation, may be applied to data bits (and to parity bits corresponding to the first ECC scheme 124) of the codewords 160-164 within the data latches 150 to generate the combined parity bits 144. The combined parity bits 144 are stored in the memory 104, such as in the combined parity portion 112 of the group of storage elements 106.

When data is to be retrieved from the memory 104, such as when a request is received from the host device 130 for a data portion of the first codeword (CW1) 160, the controller 120 may retrieve a representation 146 of the first codeword 160 from the memory 104. The representation 146 may include the data and parity bits of the first codeword 160 that are read from the memory 104 and the representation 146 may differ from the first codeword 160 due to one or more bit errors. The representation 146 of the first codeword 160 may be provided to the ECC engine 122, and the decoder 118 may perform a decoding operation according to the first ECC scheme 124 to correct bit errors in the representation 146 to recover the requested data.

If a number of bit errors occurring in the representation 146 exceeds a correction capability of the first ECC scheme 124, the decoder 118 may initiate a decoding operation using the combined codeword that includes the other codewords 162, 164 of the group 140 and the combined parity bits 144 of the combined codeword. The controller 120 may read a representation 148 of the second codeword 162, a representation 150 of the third codeword 164, and a representation 152 of the combined parity bits 144 from the memory 104. Each of the representation 148 of the second codeword 162 and the representation 150 third codeword 164 may be independently decoded by the decoder 118 according to the first ECC scheme 124. The error-corrected versions of the representation 148 of the second codeword 162 and the representation 150 of the third codeword 164 may be used, with the combined parity bits 144, by the decoder 118 to decode the first codeword 160. An example of decoding using the second ECC scheme 126 is described with respect to FIG. 3.

By generating the combined parity bits 144 using the parity generation circuitry 110 on the memory die 103, rather than at the controller 120, the combined codeword may be created after all of the codewords 160-164 of the group 140 have been stored at the memory 104. The controller 120 may therefore include a smaller amount of on-chip memory as compared to an implementation where all codewords 160-164 of the group 140 remain stored on the controller die 121 until the combined parity bits 144 are generated (e.g., using the encoder 116 to implement the second ECC scheme 126). Further, selection of codewords to be included in the group 140 (to generate a combined codeword) may be made after the individual codewords have been generated at the controller 120 and stored in the memory 104.

For example, after a sufficient number of codewords (e.g., three codewords) have been stored into the memory 104, circuitry on the memory die 103 may select the stored codewords for encoding into a combined codeword and may send the corresponding codeword data 142 to the parity generation circuit 110. To illustrate, selection of the stored codewords and generation of the combined parity bits 144 may occur during an on-chip copy operation in an implementation of the data storage device 102 where multiple codewords are selected from a SLC portion of the memory 104 to be copied into a single word line of a MLC portion of the memory 104. The combined parity bits 144 may be interleaved across multiple logical pages of the single word line of the MLC portion, such as described with respect to FIG. 2.

Although in some implementations the data storage device 102 may be implemented using SLC memory, in other implementations the data storage device 102 may store data in MLC memory. For example, the codewords 160-164 may be first stored to a SLC partition (e.g., a binary cache) and data from multiple word lines of the SLC partition may be copied to a word line of a MLC partition for higher-density storage. However, MLC memory may have a higher bit error rate than SLC memory and enhanced error recovery may be provided by generating the combined parity bits 144 of the combined codeword. In an MLC flash memory, the manner of coding voltage levels of memory cells (e.g., setting a threshold voltage of the storage element 108 to indicate a particular set of bits) and the manner of assigning input data to the memory cells may impact an error rate of stored data.

Generating the combined parity bits 144 in the memory 104 enables equal (e.g., encoding that is not differentiated based on a codeword destination in the memory 104) encoding of the codewords 160-164 at the controller 120. For example, in an MLC implementation, each logical page of a word line may have a different reliability than other logical pages of the word line as a result of various factors (such as a mapping of data bits to states of the MLC storage elements), and codewords to be stored at the different logical pages may be encoded differently to accommodate the differing reliability. The data storage device 102 may provide enhanced reliability without differentiating between codewords as a function of the logical page they will be mapped to. Further, the controller 120 is not required to access or use the mapping of data bits to states at the time of encoding using the first ECC scheme 124.

The group 140 of codewords may be stored in an SLC partition of the memory 104 without allocation of the individual codewords 160-164 to a specific destination logical page of a MLC partition. Allocation of the codewords 160-164 to logical pages of a MLC partition may be performed during transfer of the codewords 160-164 to the MLC partition. As a result, the encoding process at the encoder 116 may avoid determining an allocation of each codeword 160-164 to a logical page of the MLC partition prior to encoding the codeword 160, 162, or 164 with a code associated with the destination page. Complexity of the encoder 116 may therefore be reduced as compared to implementations where the encoder 116 adapts an encoding scheme to accommodate different reliabilities of different destination pages.

Generating the combined parity bits 144 in the parity generation circuitry 110 in the memory die 103 may provide enhanced throughput as opposed to implementations where the codewords 160-164 are transferred from the memory 104 back to the controller 120 for decoding and re-encoding. For example, if the combined parity bits 144 are generated at the ECC engine 122 instead of at the memory die 103, the codewords 160-164 may be transferred from the memory 104 to the controller 120 for generation of the combined parity bits 144, and the resulting combined codeword may be transferred back to the memory die 103 for storage. Such latency of data transfer of multiple codewords between the memory die 103 and the controller 120 may be avoided, increasing overall system performance. Further, because the combined parity bits 144 may be computed at a time after a time of encoding the codewords 160-164 (at the encoder 116), scheduling and operational flexibility may be enhanced. For example, the controller 120 need not store a copy of the first codeword 160 and the second codeword 162 at a local memory while awaiting additional data from the host device 130 to be encoded into the third codeword 164.

Selection of an error correction coding scheme used to protect user data and selection of a mapping of the codewords into pages of a MLC word line affect the reliability of the user data and the efficiency of accessing the user data (i.e., programming and reading speed). However, criteria for reliability and fast access to data are often contradictory. For example, longer error correction codes typically provide better error correction and a lower error floor than shorter error correction codes, resulting in higher reliability and improved write/erase cycling and data retention characteristics. On the other hand, using long codewords generally results in longer reading, transfer, and decoding times (i.e., increased latency). A relative effect of increased latency may increase in implementations where smaller data chunks (e.g., a 0.5 kilobyte (KB) sector of data) are accessed as compared to implementations were larger data chunks (e.g., several KBs of data) are accessed.

As a function of a mapping from bits to states, different logical pages of a word line of a MLC memory may exhibit different reliabilities (i.e., different error rates). Spanning a codeword evenly over all the pages balances the different error rates and equal reliability may be obtainable over all the data stored in a word line. However, spanning the codeword evenly over all the pages implies that all the pages are read in order to recover the data. Reading all logical pages of a word line to retrieve data increases read latency of the data.

The data storage device 102 addresses such conflicting criteria corresponding to reliability and access time by enabling storing of data using long codewords by combining multiple shorter codewords. Initially, the shorter codewords (e.g., the codewords 160-164) are encoded equally for all pages according to the first ECC scheme 124. Subsequent to storing the codewords in the memory, additional parity bits (e.g., the combined parity bits 144) are computed and may be stored in an interleaved manner for additional error correction that is applicable for codewords that may be stored in a non-interleaved manner on pages having varying reliability.

The joint parity (e.g., the combined parity bits 144) increases the robustness of stored data at a MLC word line that may have unequal error rates over the logical pages of the MLC word line and transforms the plurality of individual, shorter codewords (e.g., codewords 160, 162, and 164) into one longer codeword that may span over multiple (or all) logical pages of a single word line. The longer combined codeword using the second ECC scheme 126 can have a reduced error floor and an improved error correction capability as compared to the shorter codewords using the first ECC scheme 124. For example, adding joint parity to three codewords stored in a three bit per cell (3 BPC) flash memory, where each individual codeword has a length of approximately 8 KB, can result in a combined codeword having a length of approximately 24 KB.

According to some embodiments, data bits are first encoded into a first group of codewords and stored in the memory 104. The first group of codewords may include separate codewords for each page and the codewords are stored in the memory 104 as separate codewords. The first group of codewords may be sensed and reliably decoded while conditions of the memory 104 have not significantly changed from the time the first group of codewords was stored in the memory 104. For example, the codewords may be successfully decoded at the decoder 118 using the first ECC scheme 124 when sensing and decoding of the codewords is performed at a time close to the programming time of the codewords. As another example, the first group of codewords may be stored in a highly reliable partition of the memory, such as an SLC partition of the memory 104, and the combined parity bits 144 may be computed at a later time when the first group of codewords is to be transferred to an MLC partition of the memory 104 that is less reliable than the SLC partition. The codewords (e.g., the codewords 160-164) may be designed to be shorter than a page length to leave room for the combined parity to be added later (e.g., the codewords 160-164 do not extend into the combined parity portion 112 to enable storage of the combined parity bits 144 in the group 106 of storage elements).

The first group of codewords is encoded by the parity generation circuitry 110 according to the second ECC scheme 126 to generate a group of common parity bits (e.g., the combined parity bits 144). The encoding at the parity generation circuitry 110 may be performed after the first group of codewords is stored in the memory 104 while the time elapsed from the first encoding does not cause any of the codewords to be unreliable. In other words, at the time of the second encoding to generate the common parity bits, the first group of codewords may be reliably decodable according to the first ECC scheme 124. The common parity bits may then be stored in the memory 104, such as in an interleaved fashion as described with respect to FIG. 2.

In some implementations, because the combined parity bits 144 may be programmed to dedicated cells in the same word line as the codewords (e.g., in the parity portion 112), the codewords 160-164 may be generated to leave unoccupied a number of storage elements in each word line for storage of the combined parity bits 144. Storing the combined parity bits 144 in the group of storage elements 106 (e.g., a word line of a MLC flash memory) after programming the codewords 160-164 to the word line may be performed without first erasing the contents of the word line. For example, rewriting a flash word line is conventionally performed by erasing a full block of multiple word lines prior to rewriting data to the word line. However, since the original codewords are not subject to any change when additional parity bits are added to dedicated cells, it is possible to rewrite the word line without first erasing it.

Another option is to program the combined parity bits 144 into a different word line. For example, one set of combined parity bits for each of the word lines of a block of word lines can be written into the last word line of the block or into the last page(s) of the block. In this case, the combined parity bits may be accumulated at the controller 120 in a random access memory (RAM) while an MLC block is programmed, and once all the data has been programmed to the block, the accumulated combined parity bits are programmed to the last page(s) of the block.

Another embodiment includes encoding incoming data bits (e.g., the user data 132) using the first ECC scheme 124 into a first group of codewords. The first group of codewords is stored in an MLC partition where the codewords may be stored in different wordlines. Once the first group of codewords contains a sufficient number of codewords, the combined parity bits are computed and stored in the memory 104 but the combined parity bits may be stored in a different portion of the memory. For example, the first group of codewords may be stored in an MLC portion of the memory 104, while the combined parity may be stored in an SLC portion of the memory 104 that may allow programming of a smaller number of bits than the MLC portion. In some cases the first group of codewords may be selected as codewords which are more vulnerable, and may be chosen from different wordlines or even different blocks. Memory management may include capabilities for identifying vulnerable logical pages and computing combined parity bits for these pages.

Figure 5:
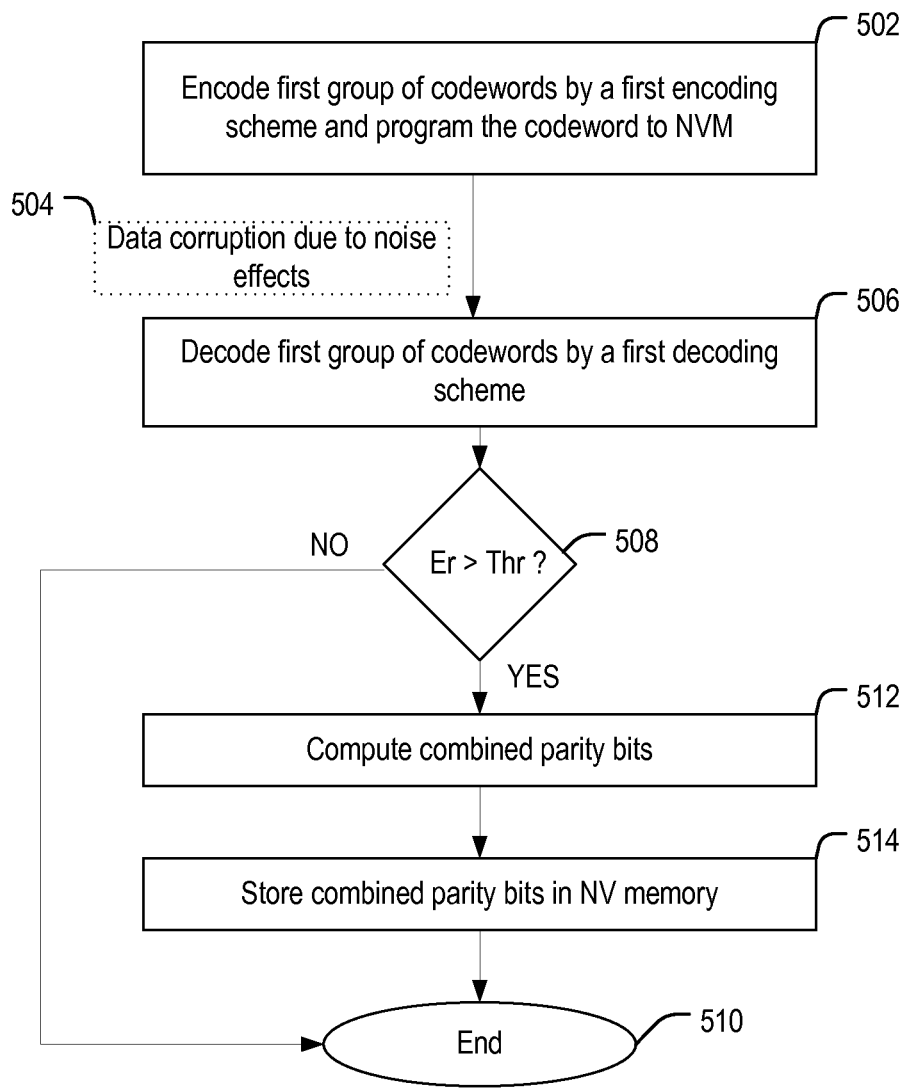
FIG. 5 is a flow diagram illustrating a particular embodiment of a method of encoding data that includes generating parity bits at a controller.

Another embodiment includes encoding incoming data bits (e.g., the user data 132) using the first ECC scheme 124 into a first group of codewords. The first group of codewords is stored in an MLC partition in a first group of memory cells, where the first group of memory cells may include cells from different wordlines\blocks. At a later time the first group of memory cells may be read and successfully decoded. If it is determined by the decoder that the number of errors in the first group of memory cells is larger than a predefined threshold, then the first group of codewords may be encoded by a second ECC encoder, to generate combined parity bits. The combined parity bits may be stored in the flash in a second group of memory cells in addition to the original first group of memory cells. The combined parity bits may be written to the same wordlines of the first group of codewords or to other wordlines in the same die. This embodiment is illustrated in FIG. 5.

Another option is to estimate the number of errors in the first group of memory cells without performing a full decoding, such as by computing the number of unsatisfied parity check (i.e., the weight of the syndrome of the codeword), or by counting the number of cells in the transition voltage band in between programming states, which may be done internally in the memory (via sensing and counting the sense result in the latch) without controller involvement. If it is determined by the error estimation that the number of errors in the first group of memory cells is larger than a first predefined threshold, a decoding operation may be applied to the first group of memory cells generating a first group of codewords, and then the first group of codewords may be encoded by a second ECC encoder, to generate combined parity bits. The combined parity bits may be stored in the memory 104 in a second group of memory cells in addition to the original first group of memory cells.

If it is determined by the error estimation that the number of errors in the first group of memory cells is less than the first predefined threshold, then the combined parity bits may be computed without first decoding and correcting the errors in the first group of memory cells. In this case, a flag may be set, such that when using the combined parity bits in a decoding process, the combined parity bits are associated with a lower reliability. The lower reliability may be a function of the estimated number of errors in the first group of memory cells, in which case the flag may be a multi-bit flag. Assuming that the errors in decoding are a function of elapsed time between the programming of the first group of memory cells and the encoding and programming of the combined parity bits, the reliability of the combined parity bits may be set as a function of the elapsed time. For example, if the combined parity bits are computed a relatively short time after programming the first group of memory cells, then a flag may be set to 0, and the reliability of the combined parity bits during decoding may not be affected by the fact that the first group of memory cells was not decoded and corrected prior to encoding the combined parity bits. However, if the combined parity bits are computed a relatively longer time after programming the first group of memory cells, then the flag may be set to 1, and the reliability of the combined parity bits may be set to a lower value during decoding. (Although a single bit flag is described, in other implementations a multi-bit flag may be used.) By accommodating errors via lower reliability of combined parity bits, wearing of the memory 104 may be reduced as compared to implementations where the group of codewords are decoded, reconstructed, encoded to generate the combined parity bits, and re-written to a different location in the memory 104.

This option demonstrates an additional advantage of the present invention over the prior art. In prior art practice if decoding (or estimating) reveals that the first group of memory cells contain a large amount of errors (higher than predefined threshold) the first group of memory cells must be decoded, and encoded again while correcting all the errors, thus generating a reconstructed first group of codewords. The reconstructed first group of codewords is programmed into a different location inside the flash and the previous cells that stored the first group of codewords are invalidated and later erased. This obviously causes the flash to suffer from additional wear, which is avoided by the present invention.

Another embodiment includes encoding incoming data bits (e.g., the user data 132) using the first ECC scheme 124 into a first group of codewords. If the first group of codewords is 'small' (e.g., the first group of codewords can be stored in one or two pages of a 3 bit-per-cell portion of the memory 104), then the first group of codewords is stored in either a temporary location, such as an SLC partition, or in an MLC partition where the codewords will occupy only one or two pages. When additional data bits are received, the additional data bits are also encoded according to the first ECC scheme 124 to form additional codewords from the first group of codewords. Once the first group of codewords contains a sufficient number of codewords, the combined parity bits are computed and stored in the memory 104 along with first group of codewords (e.g., the combined parity bits may be stored in an interleaved mode).

An optional design of the parity generation circuitry 110 may compute the combined parity bits 144 using only basic operations, such as bitwise AND, OR, and/or XOR, that may be efficiently computed in a flash memory die. Embodiments according to this option may be implemented by providing the first group of codewords to the internal parity generation circuitry 110 and computing the combined parity bits 144 in the internal parity generation circuitry 110 without transferring the codewords to the external controller 120.

According to some implementations, the combined parity bits may be determined based on sensing the memory 104 and providing the results of the sensing to the internal parity generation circuitry 110. The combined parity bits 144 are computed by the internal parity generation circuitry 110 without attempting to decode the group of codewords (e.g., without decoding the codewords 160-164) and without correcting any potential errors prior to computing the combined parity bits 144.

In case combined parity is computed internally in the memory (and not in the controller after decoding), then the combined parity may be computed after one or more errors are introduced. Assuming that an error probability p introduced by the memory at this point is low, then an error probability of combined parity bits q will also be low. More specifically, assuming each combined parity bit is computed by XORing n bits from the first group of codewords, then $q=(1-(1-p)^n)/2$. For example, assuming n=72, if $p=10^{-5}$ then $q=7.2 \times 10^{-4}$, and if $p=10^{-4}$ then $q=7.1 \times 10^{-3}$ (i.e., the error rate of the combined parity bits may still be very low compared to a rate of errors that may be introduced by the memory at a later stage). In other words, the combined parity bits may be based on a "noisy snapshot" of the information (after a small fraction of error has been introduced, e.g., by the SLC memory), but before potentially greater noise (e.g., MLC errors) is introduced. Note that in case the combined parity is computed after some errors are introduced (without correcting the errors first), then the combined parity may not be useful for decoding the data by itself; however, the combined parity can help the decoding of the data in conjunction with the parity bits of each of the first codewords.

FIG. 2 illustrates a particular embodiment of generating the combined parity bits 144 where the codewords 160-164 of FIG. 1 are programmed into an SLC partition 202 (e.g., a binary cache of the memory 104 of FIG. 1) and then copied into an MLC partition 260 (e.g., a 3 BPC flash MLC portion of the memory 104). Although FIG. 2 illustrates a SLC-to-MLC implementation, other implementations may not include programming the codewords 160-164 to an SLC partition and may instead include direct programming of the codewords 160-164 to the MLC partition 260.

The first codeword 160 is written to a first SLC page 204 (e.g., in a first word line of the SLC partition 202), the second codeword 162 is written to a second SLC page 206 (e.g., in a second word line of the SLC partition 202), and the third codeword 164 is written to a third SLC page 208 (e.g., in a third word line of the SLC partition 202). Each codeword 160-164 has a length of N bytes, leaving some unused cells (e.g., at the end of each page) corresponding to bit locations for storage of the common parity bits after transfer to the MLC partition 260. After programming the codewords 160-164 to the SLC partition 202 (either sequentially as part of a single operation or separately as multiple unrelated data write operations), the three codewords 160-164 are sensed and provided to the parity generation circuitry 110. For example, each of the codewords 160-164 may be sensed and the data copied to latches on the memory die 103 of FIG. 1, such as the data latches 150.

The parity generation circuitry 110 applies a bitwise logical operation 222 to the three codewords 160-164. For example, the parity generation circuitry 110 may perform an exclusive-OR (XOR) operation to the first bit of the first codeword 160, to the first bit of the second codeword 162, and to the first bit of the third codeword 164 to generate a first bit of a resulting data word 232. The codewords 160-164 may be XORed bit-by-bit to form the data word 232 having N bytes. The length of the data word 232 matches the length of the original codewords 160-164 and is ⅓ of the combined length of the three codewords 160-164.

Figure 3:
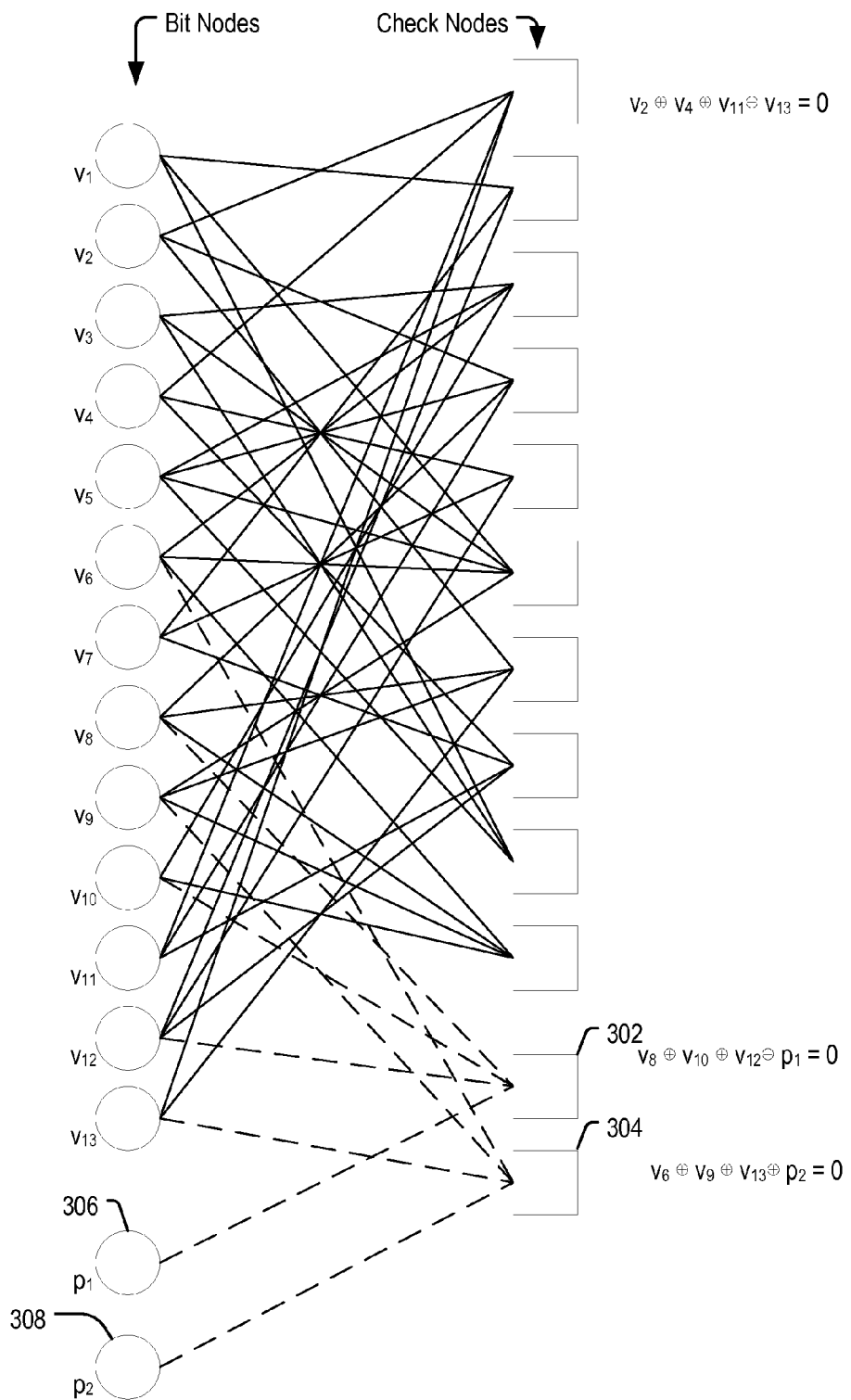
FIG. 3 is a diagram illustrating an example of a modified Tanner graph corresponding to decoding of data using the parity bits of FIG. 2.

Each bit of the combined parity bits (Pj) 144 may be generated by combining multiple bits of the data word 232 according to a logical operation, such as a XOR operation. For example, multiple bits 240 of the data word 232 may be combined via a XOR operation to generate a bit 242 of the combined parity bits (Pj) 144. As illustrated in FIG. 3, the data word 232 may be partitioned into t segments (where t is an integer greater than zero), such as into multiple consecutive segments of equal length. In each segment, a XOR operation may be applied to the bits of the segment to generate one bit per segment (e.g., the bit 242).

Each codeword 160-164, together with a corresponding portion of the combined parity bits 144, is copied to a respective logical page of a physical page (e.g., a word line) of the MLC partition 260. As illustrated, a first portion Pj(1) of the combined parity bits 144 may be appended to the first codeword 160 and stored into a first page (e.g., an "Upper" logical page) 264 of the MLC word line. A second portion Pj(2) of the combined parity bits 144 may be appended to the second codeword 162 and stored into a second page (e.g., a "Middle" logical page) 266 of the MLC word line. A third portion Pj(3) of the combined parity bits 144 may be appended to the third codeword 164 and stored into a third page (e.g., a "Lower" logical page) 268 of the MLC word line. The portions Pj(1), Pj(2), and Pj(3) may each have a length of M bytes to match a size of the parity portion 112.

After programming to the MLC word line, each of the codewords 160-164 is non-interleaved and can be retrieved by reading a single page of the MLC word line. However, the combined parity bits 144 are interleaved over the pages 264-268. As a result, an overall bit error rate of the combined parity bits 144 corresponds to an average bit error rate of the logical pages 264-268 that is less than an error rate of the least reliable of the logical pages 264-268.

Although FIG. 2 illustrates that the combined parity bits 144 are segmented into multiple portions Pj(1), Pj(2), and Pj(3) and each portion is stored in a respective logical page 264, 266, and 268 of a single word line, in other implementations the parity bits Pj of the combined codeword may be stored into a different word line of the MLC portion 260. The combined parity bits Pj 144 may be used to assist in recovery of one or more of the codewords 260-264 according to the second ECC scheme 126 of FIG. 1 in the event that decoding using the first ECC scheme 124 is unsuccessful, such as described with respect to FIG. 3.

As an example, the first codeword 160 may be read from the first MLC page 264 and successfully decoded using the first ECC scheme 124. Similarly, the second codeword 162 may be read from the second MLC page 266 and decoding using the first ECC scheme 124. However, the third codeword 164 read from the third MLC page 268 may have a greater number of bit errors than a correction capability of the first ECC scheme 124. In this case, the combined parity bits 144 read from the MLC partition 260 may be used to provide enhanced error correction capability to recover the third codeword 164 using the second ECC scheme 126.

Each bit of the combined parity bits Pj 144 illustrated in FIG. 2 is a result of a XOR operation of bits of the first codeword 160, the second codeword 162, and the third codeword 164. In addition, each bit of the combined parity bits Pj 144 has a value associated with it that is read from the MLC partition 260 of the memory 104. Each particular bit (e.g., the first bit) of the combined parity bits Pj 144 may be expressed as:

$$P_{j,m} = \Sigma_i p_i^{(1)} \oplus \Sigma_i p_i^{(2)} \oplus \Sigma_i p_i^{(3)} \quad (1)$$

where $P_{j,m}$ represents the m-th bit of Pj, i represents indices of bits that are XORed together from a corresponding codeword (e.g., the indices of the t bits 240 illustrated in FIG. 2 that are used to determine the bit 242), $\oplus$ represents a XOR operation, $\Sigma_i p_i^{(1)}$ represents the XOR of the i bits of the first codeword 160, $\Sigma_i p_i^{(2)}$ represents the XOR of the i bits of the second codeword 162, and $\Sigma_i p_i^{(3)}$ represents the XOR of the i bits of the third codeword 164.

After successful decoding of the first and second codewords 160, 162 and reading a representation $\tilde{P}_{j,m}$ of the m-th bit of $P_j$ from the MLC partition, the relationship:

$$\Sigma_i p_i^{(3)} = \tilde{P}_{j,m} \oplus \Sigma_i p_i^{(1)} \oplus \Sigma_i p_i^{(2)} = p \quad (2)$$

is true when $\tilde{P}_{j,m}$ is read without a bit error. In Equation (2), p represents known values that can be used to assist in decoding the third codeword 164 (that includes the bits $p_i^{(3)}$).

FIG. 3 illustrates an example of a Tanner graph of the third codeword 164 depicting bit nodes $v_1, v_2, \ldots v_{13}$ (depicted as circles) and check nodes (depicted as squares) corresponding to the first ECC scheme 124 and that has been modified by adding additional check nodes 302 and 304 for each bit of Pj, and connecting all the bit nodes participating in a check to the corresponding check node. In addition, an additional bit node 306 is added to the Tanner graph. This additional bit node 306 is connected to a check node if the corresponding value of p in Equation (2) is 1. Another option is to always connect the additional bit node (e.g., include a bit node for each bit of the combined parity bits 144) to each new check node, but to assign the additional bit nodes for bits with a corresponding log likelihood ratio (LLR) value according to the probability that p=0.

The richer structure of the modified Tanner graph can be used to decode the third codeword 164.

As a specific example, the first bit $P_{j,1}$ of Pj corresponding to the additional bit node 306 is computed (in the example of FIG. 3) as:

$$P_{j,1} = p_8^{(1)} \oplus p_8^{(2)} \oplus p_8^{(3)} \oplus p_{10}^{(1)} \oplus p_{10}^{(2)} \oplus p_{10}^{(3)} \oplus p_{12}^{(1)} \oplus p_{12}^{(2)} \oplus p_{12}^{(3)} \quad (3)$$

Substituting the values of $$\tilde{P}_{j,1}, p_8^{(1)}, p_8^{(2)}, p_{10}^{(1)}, p_{10}^{(2)}, p_{12}^{(1)}, \text{ and } p_{12}^{(2)} \quad (4)$$

into Equation (3) results in the equation $$p_8^{(3)} \oplus p_{10}^{(3)} \oplus p_{12}^{(3)} \oplus p_1 = 0, \quad (5)$$

that is represented by the additional check node 302 of FIG. 3, and $$p_1 = \tilde{P}_{j,1} \oplus p_8^{(1)} \oplus p_8^{(2)} \oplus p_{10}^{(1)} \oplus p_{10}^{(2)} \oplus p_{12}^{(1)} \oplus p_{12}^{(2)} \quad (6)$$

is represented by the additional variable node 306 of FIG. 3, and the LLR associated with $p_1$ is the LLR of $\tilde{P}_{j,1}$.

The second bit $P_{j,2}$ of Pj corresponding to the additional bit node 308 is computed (in the example of FIG. 3) as:

$$P_{j,2} = p_6^{(1)} \oplus p_6^{(2)} \oplus p_6^{(3)} \oplus p_9^{(1)} \oplus p_9^{(2)} \oplus p_9^{(3)} \oplus p_{13}^{(1)} \oplus p_{13}^{(2)} \oplus p_{13}^{(3)} \quad (7)$$

Substituting the values of $$\tilde{P}_{j,2}, p_6^{(1)}, p_6^{(2)}, p_9^{(2)}, p_{13}^{(1)}, \text{ and } p_{13}^{(2)} \quad (8)$$

into Equation (7) results in the equation $$p_6^{(3)} \oplus p_9^{(3)} \oplus p_{13}^{(3)} \oplus p_2 = 0, \quad (9)$$

that is represented by the additional check node 304 of FIG. 3, and $$p_2 = \tilde{P}_{j,2} \oplus p_6^{(1)} \oplus p_6^{(2)} \oplus p_9^{(1)} \oplus p_9^{(2)} \oplus p_{13}^{(1)} \oplus p_{13}^{(2)} \quad (10)$$

is represented by the additional variable node 308 of FIG. 3, and the LLR associated with $p_2$ is the LLR of $\tilde{P}_{j,2}$.

It should be understood that the modified Tanner graph depicted in FIG. 3 is simplified for ease of explanation. The unmodified Tanner graph may be implemented with a greater number (e.g., thousands) of bit nodes v and corresponding check nodes and may be modified to include a greater number (e.g. hundreds) of additional check nodes 302, 304 as well as additional bit nodes p. For the example illustrated in FIG. 2, the number of added variable nodes is 3M, while each variable node is derived from $\tilde{P}_{j,m}$, j=1, 2, 3 and m=1, . . . , M. It should also be understood that graphical depictions of relationships between bit nodes and check nodes, such as the Tanner graph of FIG. 3, are provided for illustrative purposes only and may not be implemented by an ECC decoder.

Although FIGS. 1-3 illustrate embodiments where three codewords 160-164 are combined to generate the combined parity bits 144, in other embodiments a different number of codewords, such as two codewords, four codewords, or a greater number of codewords may be used to generate the combined parity bits 144. Although FIGS. 2-3 are described with respect to a 3 BPC implementation, other embodiments may use a 1 BPC, 2 BPC, 4 BPC, or any other number of bits per storage element implementation. In addition, although FIGS. 1-3 describe the first ECC scheme 124 as a single encoding scheme including data bits and parity bits, in other implementations the first ECC scheme may include a multi-level encoding scheme. For example, one or more of the codewords 160, 162, and 164 may be a combined codeword (e.g., that is generated by the ECC encoder 116) that includes multiple independently-decodable codewords combined into a larger codeword using joint parity. Use of such combined codewords as the codewords 160, 162, and 164 may provide reduced random-access read latency of data segments in each of the codewords 160, 162, and 164. Further, the codewords 160, 162, and 164 may be generated by any type of error correction scheme (or may be un-encoded data), so that the encoding scheme used to generate the first codeword 160 may be different from the encoding scheme used to generate the second codeword 162 and/or the third codeword 164.

Figure 4:
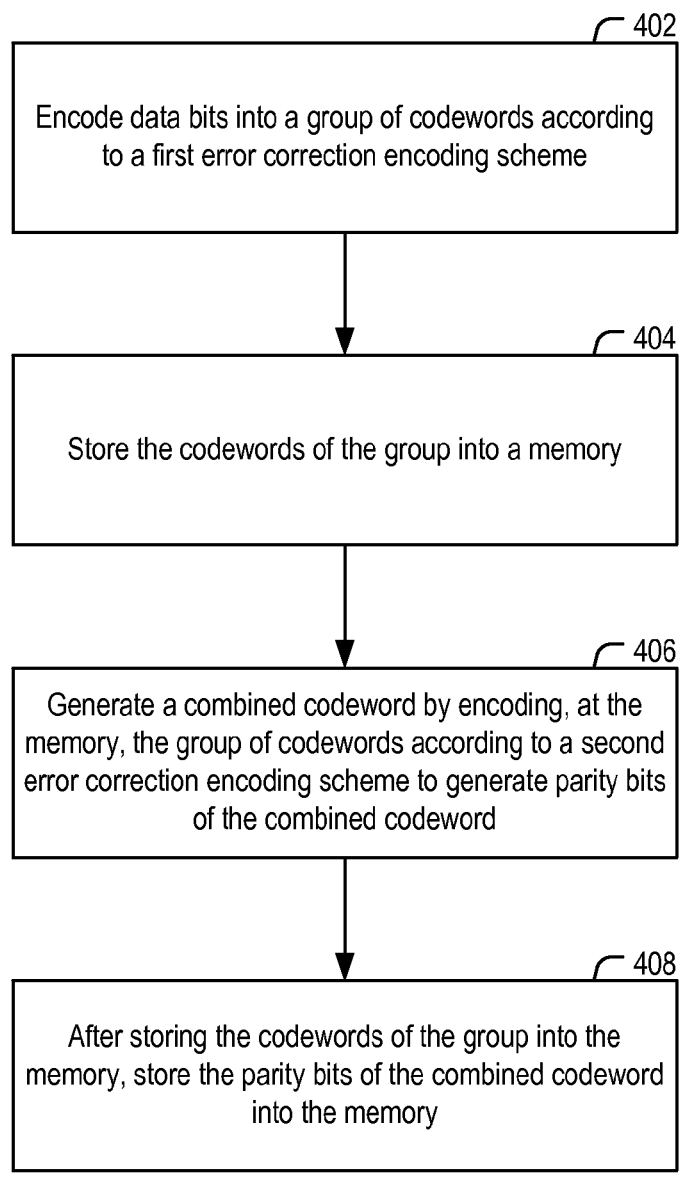
FIG. 4 is a flow diagram illustrating a particular embodiment of a method of encoding data that includes generating parity bits at a non-volatile memory.

Referring to FIG. 4, a particular embodiment of a method 400 is depicted. The method 400 may be performed in a data storage device, such as the data storage device 102 of FIG. 1.

Data bits are encoded into a group of codewords according to a first error correction encoding scheme, at 402. Encoding the data bits according to the first error correction encoding scheme can be performed in a controller of a data storage device, such as the first ECC scheme 124 in the controller 120 of FIG. 1.

The codewords of the group are stored into a memory, at 404. For example, the codewords 160-164 may be stored into separate word lines of a SLC portion of a flash memory (e.g., a binary cache). As another example, the codewords 160-164 may be stored to a MLC portion of a flash memory via direct programming to the MLC partition.

A combined codeword is generated by encoding, at the memory, the group of codewords according to a second error correction encoding scheme to generate parity bits of the combined codeword, at 406. For example, encoding of the group of codewords 140 at the memory 104 of FIG. 1 is performed by the parity generation circuitry 110 that is on the same memory die 103 as the memory 104 and without transfer of the group of codewords 140 to the controller die 121. Encoding the group of codewords according to the second error correction encoding scheme may be performed by applying a bitwise logical operation, such as the bitwise logical operation 222 of FIG. 2. For example, each of the parity bits of the combined codeword may be generated according to an XOR operation of bits from each codeword of the group of codewords.

After storing the codewords of the group into the memory, the parity bits of the combined codeword are stored into the memory, at 408. For example, in the implementation illustrated in FIG. 2, after the codewords are stored into the memory (e.g., into a SLC portion of a flash memory), the codewords may be read from the memory and the parity bits of the combined codeword may be generated within a memory die that includes the memory. The combined codeword may be stored into a multi-level cell (MLC) portion of the flash memory.

The combined codeword may be stored into multiple logical pages of a single word line of a multi-level cell (MLC) portion of a flash memory. For example, each of the codewords of the group may be stored in a respective one of the logical pages. The parity bits of the combined codeword may be segmented into multiple portions and each portion may be stored in a respective logical page of the single word line, such as depicted in FIG. 2. Alternatively, the parity bits of the combined codeword may be stored into a different word line of the MLC portion.

Each of the codewords of the group of codewords may be encoded independently of the other codewords of the group of codewords. The codewords of the group of codewords may be programmed into a binary cache portion of the memory, and the parity bits of the combined codeword may be generated by reading the codewords of the group from the binary cache into data latches within the memory and performing a bit-wise logical operation to data bits of the codewords within the data latches.

By generating the combined parity bits at the memory, enhanced error correction capability due to longer codeword length may be attained without increased latency of additional data transfer to and from the controller and/or with reduced controller complexity and reduced controller RAM as compared to implementations where parity bits of a multi-page codeword are generated at the controller. Generating the combined parity bits at the memory enables encoding of the combined parity in parallel. With the encoding performed in the internal latches of the memory, each plane of the memory may encode its second parity bits in parallel with the other planes. If the encoding is performed at the controller and the controller and the bus connecting the controller to the memory array are shared, parallel encoding of second parity bits at multiple planes of the memory may be prevented.

FIG. 5 depicts a method of encoding data that includes generating parity bits at a controller, such as the controller 120 of FIG. 1. A first group of codewords may be encoded by first encoding scheme to generate a first group of codewords and the first group of codewords may be programmed to a non-volatile memory, at 502. For example, the group of codewords 140 may be generated at the controller 120 and stored in the memory 104. While stored in the non-volatile memory, or during transfer of the first group of codewords, data corruption may occur, such as due to noise effects, at 504.

The first group of codewords may be decoded by a first decoding scheme, at 506. For example, the first group of codewords 140 of FIG. 1 may be read from the memory 104, transferred to the controller 120, and decoded at the decoder 118. Decoding the first group of codewords may result in an indication of a number of bit errors corrected during decoding, and a determination may be made whether the number of bit errors (Er) exceeds an error threshold (Thr), at 508. In response to the number of bit errors not exceeding the error threshold, the method may end, at 510.

Otherwise, in response to the number of bit errors exceeds the error threshold, combined parity bits may be generated, at 512, and the combined parity bits may be stored in non-volatile memory, at 514. For example, the combined parity bits may be generated by an encoder at the controller 120 according to the second ECC scheme 126 and transferred to the memory 104 for storage.

Although various components depicted herein are illustrated as block components and described in general terms, such components may include one or more microprocessors, state machines, or other circuits configured to enable the data storage device 102 of FIG. 1 to generate combined codewords by generating combined parity bits for data stored at the memory 104. For example, the parity generation circuitry 110 may represent physical components, such as latches, exclusive-OR circuits, hardware controllers, state machines, logic circuits, or other structures, to enable the parity generation circuitry 110 of FIG. 1 to receive data stored at the non-volatile memory 104, apply one or more operations to generate the combined parity bits 144, and provide the combined parity bits for storage at the non-volatile memory 104.

The ECC engine 122 may be implemented using a microprocessor or microcontroller programmed to attempt decoding of a retrieved codeword using the first ECC scheme 124 and, if decoding fails using the first ECC scheme, to perform decoding using the second ECC scheme based on the combined parity bits 144 of the combined codeword that includes the retrieved codeword and based on one or more of the other codewords included in the combined codeword. In a particular embodiment, the ECC engine includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
encoding first data according to a first error correction encoding scheme to form a first codeword;
encoding second data according to the first error correction encoding scheme to form a second codeword;
storing the first and second codewords into a memory;
encoding, at the memory, the first and second codewords according to a second error correction encoding scheme to generate parity bits of a combined codeword including the first and second codewords; and
after storing the first and second codewords into the memory, storing the parity bits of the combined codeword into the memory.

2. The method of claim 1, wherein the memory includes a non volatile memory.

3. The method of claim 2, wherein the non volatile memory includes a flash memory.

4. The method of claim 1, further comprising, after storing the first and second codewords into the memory, reading the first and second codewords from the memory and generating the parity bits of the combined codeword, wherein the parity bits are generated within a memory die that includes the memory.

5. The method of claim 4, wherein the memory includes a flash memory, wherein the first and second codewords are stored into a single level cell (SLC) portion of the flash memory, and wherein the combined codeword is stored into a multi-level cell (MLC) portion of the flash memory.

6. The method of claim 1, wherein the memory includes a flash memory, further comprising storing the combined codeword into multiple logical pages of a single word line of a multi-level cell (MLC) portion of the flash memory, wherein each of the first and second codewords is stored in a respective one of the logical pages.

7. The method of claim 6, further comprising segmenting the parity bits of the combined codeword into multiple portions, wherein each portion is stored in a respective logical page of the single word line.

8. The method of claim 6, further comprising storing the parity bits of the combined codeword into a different word line of the MLC portion than the single word line.

9. The method of claim 6, further comprising, after storing the first and second codewords into the memory:
transferring the first and second codewords to the MLC portion;
allocating the first codeword to a first logical page of the multiple logical pages; and
allocating the second codeword to a second logical page of the multiple logical pages.

10. The method of claim 1, wherein encoding the first and second codewords according to the second error correction encoding scheme is performed by applying a bitwise logical operation to the first and second codewords.

11. The method of claim 10, wherein each of the parity bits of the combined codeword is generated according to an XOR operation of bits from each of the first and second codewords.

12. The method of claim 1, wherein encoding the first data and the second data according to the first error correction encoding scheme is performed in a controller of a data storage device, the controller coupled to the memory, and wherein the parity bits of the combined codeword are generated in the memory.

13. The method of claim 12, wherein each codeword of a group of codewords is encoded independently of each other codeword of the group of codewords, wherein the codewords of the group of codewords are programmed into a binary cache portion of the memory, and wherein the parity bits of the combined codeword are generated by reading the codewords of the group from the binary cache into data latches within the memory and performing a bit-wise logical operation to data bits of the codewords within the data latches.

14. The method of claim 1, wherein the first and second codewords are stored in a word line of the memory and wherein the parity bits of the combined codeword are written into the word line without first erasing the first and second codewords from the word line.

15. A method comprising:
- encoding data bits into first codewords according to a first error correction encoding scheme;
- storing each of the first codewords into a memory;
- reading the first codewords from the memory; and
- in response to a value of an error indicator exceeding a threshold:
  - generating rarity bits of a combined codeword according to a second error correction encoding scheme, the combined codeword including multiple codewords of the first codewords; and
  - storing the parity bits of the combined codeword into the memory.

16. The method of claim 15, further comprising decoding the first codewords to generate the data bits, wherein the value of the error indicator corresponds to a number of errors detected during decoding the first codewords.

17. The method of claim 15, further comprising determining the value of the error indicator by estimating a number of errors in the first codewords without decoding the first codewords.

18. A data storage device comprising:
- a memory;
- a controller coupled to the memory, wherein the controller is configured to encode data bits into first codewords according to a first error correction encoding scheme and to send the first codewords to be stored in the memory; and
- parity generation circuitry configured to generate parity bits of a combined codeword according to a second error correction encoding scheme, the combined codeword including multiple codewords of the first codewords, and
- wherein the memory is configured to store the parity bits of the combined codeword after storing the first codewords into the memory.

19. The data storage device of claim 18, further comprising a memory die that includes the memory and the parity generation circuitry, wherein the parity generation circuitry is configured to receive the first codewords read from the memory to generate the parity bits of the combined codeword.

20. The data storage device of claim 19, wherein the memory is a flash memory, wherein the first codewords are stored into a single level cell (SLC) portion of a flash memory, and wherein the combined codeword is stored into a multi-level cell (MLC) portion of the flash memory.

21. The data storage device of claim 18, wherein the memory is a flash memory, wherein the combined codeword is stored into multiple logical pages of a single word line of a multi-level cell (MLC) portion of the flash memory, and wherein each of the first codewords is stored in a respective one of the logical pages.

22. The data storage device of claim 21, wherein the parity bits of the combined codeword are segmented into multiple portions and wherein each portion is stored in a respective logical page of the single word line.

23. The data storage device of claim 21, wherein the parity bits of the combined codeword are stored into a different word line of the MLC portion than the single word line.

24. The data storage device of claim 21, wherein allocation of the first codewords to the multiple logical pages is performed during transfer of the first codewords to the MLC portion.

25. The data storage device of claim 18, wherein generating the parity bits of the combined codeword according to the second error correction encoding scheme is performed by applying a bitwise logical operation to each of the first codewords.

26. The data storage device of claim 25, wherein each of the parity bits of the combined codeword is generated according to an XOR operation of bits from each of the multiple codewords.

27. The data storage device of claim 18, wherein encoding the data bits according to the first error correction encoding scheme is performed at an error correction code (ECC) engine on a controller die that includes the controller and wherein the parity generation circuitry is included on a memory die that includes the memory.

28. The data storage device of claim 27, wherein each first codeword of a group of first codewords is encoded independently of each other first codeword of the group of first codewords, wherein the first codewords of the group of first codewords are programmed into a binary cache portion of the memory, and wherein the parity bits of the combined codeword are generated by reading the first codewords of the group from the binary cache into data latches on the memory die and performing a bit-wise logical operation to data bits of the first codewords within the data latches.

29. The data storage device of claim 18, wherein the first codewords are stored in a word line of the memory and wherein the parity bits of the combined codeword are written into the word line without first erasing the first codewords from the word line.

30. A data storage device comprising:
- a memory; and
- a controller coupled to the memory, wherein the controller is configured to encode data bits into first codewords according to a first error correction encoding scheme and to send the first codewords to be stored in the memory, wherein the controller is further configured to receive the first codewords from the memory,
- wherein, in response to a value of an error indicator exceeding a threshold, the controller is configured to generate parity bits of a combined codeword according to a second error correction encoding scheme and to send the parity bits of the combined codeword to be stored in the memory, the combined codeword including multiple codewords of the first codewords.

31. The data storage device of claim 30, wherein the controller is configured to decode the first codewords to generate the data bits, and wherein the value of the error indicator corresponds to a number of errors detected during decoding the first codewords.

32. The data storage device of claim 30, wherein the value of the error indicator is determined by estimating a number of errors in the first codewords without decoding the first codewords.

* * * * *

UNITED STATES PATENT AND TRADEMARK OFFICE
CERTIFICATE OF CORRECTION

PATENT NO.        : 9,124,300 B2
APPLICATION NO.   : 13/781321
DATED             : September 1, 2015
INVENTOR(S)       : Eran Sharon et al.

Page 1 of 1

It is certified that error appears in the above-identified patent and that said Letters Patent is hereby corrected as shown below:

In the Claims,

Claim 15 (Column 17, Line 8) "generating rarity bits of a combined codeword according" should be --generating parity bits of a combined codeword according--.

Signed and Sealed this
Twenty-second Day of March, 2016

Michelle K. Lee
*Director of the United States Patent and Trademark Office*